United States Patent
Uematsu (10) Patent No.: US 11,222,241 B2
(45) Date of Patent: Jan. 11, 2022

(54) CHARGED PARTICLE BEAM APPARATUS AND MACHINE LEARNING METHOD

(71) Applicant: JEOL Ltd., Tokyo (JP)

(72) Inventor: Fuminori Uematsu, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/415,514

(22) Filed: May 17, 2019

(65) Prior Publication Data
US 2019/0362189 A1 Nov. 28, 2019

(30) Foreign Application Priority Data

May 25, 2018 (JP) .............................. JP2018-100932

(51) Int. Cl.
  *G06K 9/62* (2006.01)
  *G06N 20/00* (2019.01)
  *H01J 37/22* (2006.01)
  *H01J 37/28* (2006.01)

(52) U.S. Cl.
  CPC ......... *G06K 9/6262* (2013.01); *G06K 9/6256* (2013.01); *G06N 20/00* (2019.01); *H01J 37/222* (2013.01); *H01J 37/28* (2013.01); *G06T 2207/20092* (2013.01); *H01J 2237/221* (2013.01)

(58) Field of Classification Search
  CPC .... G06K 9/6262; G06K 9/6256; G06N 20/00; H01J 37/222; H01J 37/28; H01J 2237/221
  See application file for complete search history.

(56) References Cited

U.S. PATENT DOCUMENTS

| | | | | |
|---|---|---|---|---|
| 6,538,248 B1 * | 3/2003 | Kametani | ............... | H01J 37/28 250/310 |
| 6,664,546 B1 * | 12/2003 | McCord | .................. | H01J 37/28 250/310 |
| 7,071,969 B1 * | 7/2006 | Stimson, III | ..... | H04N 5/232133 348/207.11 |

(Continued)

FOREIGN PATENT DOCUMENTS

| | | |
|---|---|---|
| JP | 1167136 A | 3/1999 |
| JP | 2006269489 A | 10/2006 |

(Continued)

OTHER PUBLICATIONS

Japanese Office Action issued in JP2018100932 dated Oct. 13, 2020.

(Continued)

*Primary Examiner* — Vincent Rudolph
*Assistant Examiner* — Timothy Choi
(74) *Attorney, Agent, or Firm* — The Webb Law Firm (57) ABSTRACT

An image conversion unit includes a selector and a plurality of image converters. Each image converter is formed from an estimator of machine learning type, and estimates, based on an image acquired under a first observation condition and as a reference image, an image which is presumed to be acquired under a second observation condition. When a particular reference image is selected from among a plurality of reference images displayed on a display, a second observation condition corresponding to the selected reference image is set in an observation mechanism as a next observation condition.

3 Claims, 10 Drawing Sheets

(56) References Cited

U.S. PATENT DOCUMENTS

| | | | |
|---|---|---|---|
| 2003/0206027 A1* | 11/2003 | Nozoe | H01J 37/265 324/754.22 |
| 2006/0215901 A1 | 9/2006 | Nakagaki et al. | |
| 2010/0128970 A1 | 5/2010 | Nakagaki et al. | |
| 2013/0222430 A1 | 8/2013 | Bredno et al. | |
| 2017/0169558 A1* | 6/2017 | Kim | G06T 7/529 |
| 2017/0200265 A1* | 7/2017 | Bhaskar | G06T 7/001 |
| 2017/0213695 A1* | 7/2017 | Bizen | H01J 37/244 |
| 2017/0345140 A1 | 11/2017 | Zhang et al. | |
| 2018/0232869 A1* | 8/2018 | Enyama | G06T 5/001 |
| 2018/0240225 A1 | 8/2018 | Harada et al. | |
| 2020/0126201 A1 | 4/2020 | Harada et al. | |

FOREIGN PATENT DOCUMENTS

| | | | |
|---|---|---|---|
| JP | 2014142871 A | 8/2014 | |
| JP | WO2016016927 A1 | 4/2016 | |
| JP | 2018137275 A | 8/2018 | |
| WO | 2012056379 A1 | 5/2012 | |
| WO | 2017205537 A1 | 11/2017 | |

OTHER PUBLICATIONS

Ounkomol et al.; "Label-free prediction of three-dimensional fluorescence images from transmitted light microscopy"; May 23, 2018; retrieved from the Internet https://www.biorxiv.org/content/biorxiv/early/2018/05/23/289504.full-text.pdf.

Rivenson et al.; "Deep learning enhanced mobile-phone microscopy"; Arxiv.org, Cornell University Library, 201 Olin Library Cornell University Ithaca, NY 14853, Dec. 12, 2017.

Rivenson et al.; "Deep Learning Microscopy"; Arxiv.org, Cornell University Library, 201 Olin Library Cornell University Ithaca, NY 14853, May 12, 2017.

Zhu et al.; "Unpaired Image-to-Image Translation using Cycle-Consistent Adversarial Networks"; Arxiv.org, Cornell University Library, 201 Olin Library Cornell University Ithaca, NY 14853, Mar. 30, 2017.

Extended European Search Report issued in EP19174992.8 dated Oct. 23, 2019.

Office Action issued in JP2018-100932 dated Jun. 1, 2021.

* cited by examiner

FIG. 2

| OBSERVATION CONDITION NAME | CONTENT OF OBSERVATION CONDITION (ACCELERATION VOLTAGE, IRRADIATION CURRENT, DEGREE OF VACUUM, WORKING DISTANCE, DETECTION METHOD, ...) |
|---|---|
| A | ****, ****, ****, ****, ****, ... |
| B | ****, ****, ****, ****, ****, ... |
| C | ****, ****, ****, ****, ****, ... |
| ... | |

FIG. 3

| | | SECOND OBSERVATION CONDITION (PRESUMED OBSERVATION CONDITION) | | | | |
|---|---|---|---|---|---|---|
| | | A | B | C | D | ... |
| FIRST OBSERVATION CONDITION (CURRENT OBSERVATION CONDITION) | A | — | CONVERSION TYPE a1 (A→B) | CONVERSION TYPE a2 (A→C) | CONVERSION TYPE a3 (A→D) | 72a |
| | B | CONVERSION TYPE b1 (B→A) | — | CONVERSION TYPE b2 (B→C) | CONVERSION TYPE b3 (B→D) | |
| | C | CONVERSION TYPE c1 (C→A) | CONVERSION TYPE c2 (C→B) | — | CONVERSION TYPE c3 (C→D) | |
| | D | CONVERSION TYPE d1 (D→A) | CONVERSION TYPE d2 (D→B) | CONVERSION TYPE d3 (D→C) | — | |
| | ... | | | | | |

CHARGED PARTICLE BEAM APPARATUS AND MACHINE LEARNING METHOD

CROSS-REFERENCE TO RELATED APPLICATION

This application claims priority to Japanese Patent Application No. 2018-100932 filed May 25, 2018, the disclosure of which is hereby incorporated by reference in its entirety.

BACKGROUND OF THE INVENTION

Field of the Invention

The present disclosure relates to a charged particle beam apparatus, and in particular to an image conversion technique.

Description of Related Art

As charged particle beam apparatus, there are known an observation apparatus which uses an electron beam, an observation apparatus which uses an ion beam, and the like. As the observation apparatus which uses the electron beam, a scanning electron microscope (SEM) and a transmission electron microscope (TEM) can be exemplified. In the following description, the scanning electron microscope will be exemplified.

In the scanning electron microscope, in order to acquire a desired image by observation of a target, an observation condition must be appropriately set according to the target, an observation objective, or the like. Specifically, an acceleration voltage, an irradiation current, a scanning rate, a detection method, or the like must be appropriately set. If the observation condition differs, the acquired image would also differ. Normally, adjustment of the observation condition is repeated so that a desired image can be acquired. It is very difficult for a person with little knowledge or experience to find an optimum observation condition. Even for a person with ample knowledge and great expertise, quickly setting the optimum observation condition is not necessarily easy. When adjustment of the observation condition requires a long period of time, damage to the target may become non-negligible. Adjustment of the observation condition is also executed for charged particle beam apparatuses other than the scanning electron microscope.

The scanning electron microscope of the related art is not provided with a function to display, while not changing a current observation condition, an image which is presumed to be acquired under another observation condition. This is similarly true for charged particle beam apparatuses other than the scanning electron microscope. JP 2014-142871 A discloses an apparatus which generates teacher data which is used in a machine learning of an image classifier.

SUMMARY OF THE INVENTION

An advantage of the present disclosure lies in enabling reference to an image which is presumed to be acquired if the observation condition is changed, without actually changing the observation condition. Alternatively, an advantage of the present disclosure lies in reducing burden of a user in setting the observation condition.

According to one aspect of the present disclosure, there is provided a charged particle beam apparatus comprising: an observation mechanism that observes a target by irradiation of a charged particle beam to the target; an estimator that estimates, based on a current image acquired by the observation mechanism under a current observation condition and as a reference image, an image which is presumed to be acquired by the observation mechanism under a presumed observation condition; and a display that displays the reference image.

According to the above-described structure, the reference image is generated by the estimator based on the current image, and is displayed on the display. The reference image is an image which is expected to be acquired under a presumed observation condition, and thus, is an estimated image. By observation of the reference image, appropriateness of the presumed observation condition can be judged. When it is judged that the presumed observation condition is proper, the presumed observation condition may be set as an actual observation condition (that is, a next observation condition), or the observation of the target may be continued while applying an image conversion corresponding to the presumed observation condition. In the embodiment, the scanning electron microscope is exemplified as the charged particle beam apparatus, but alternatively, the above-described structure may be applied to, for example, a transmission electron microscope, an ion beam apparatus, or the like. The observation condition is basically a condition related to formation of the charged particle beam and a detection method. In the embodiment, the reference image is displayed in real time while the target is observed. Alternatively, the reference image may be generated and displayed based on a stored image.

According to another aspect of the present disclosure, the estimator includes an image conversion unit of a machine learning type, which converts the current image to the reference image. According to this structure, image conversion of high precision can be realized by a relatively simple method of machine learning. Alternatively, a learned parameter set may be generated at another apparatus through a machine learning process, and then, the learned parameter set may be provided to the image conversion unit of the present apparatus. Alternatively, the reference image may be estimated by a function computation, a matrix computation, or the like.

According to another aspect of the present disclosure, the image conversion unit converts the current image to a plurality of reference images corresponding to a plurality of presumed observation conditions, and the display displays the plurality of reference images. In this structure, by a comparison of the plurality of reference images, it becomes possible to narrow down an optimum observation condition or an optimum image conversion condition. Alternatively, the current image may be displayed along with the plurality of reference images.

According to another aspect of the present disclosure, the image conversion unit comprises: a storage unit which stores a plurality of learned parameter sets; and an engine to which a selected learned parameter set is incorporated from among the plurality of learned parameter sets, and the plurality of learned parameter sets and the engine as a whole function as a plurality of image converters of machine learning type. The engine is a portion which functions by incorporation of the learned parameter set, and forms, for example, a CNN platform or a CNN model. By sharing the engine among the plurality of learned parameter sets, an advantage in cost can be obtained. The engine is a software program representing an algorithm, a module, a mathematical formula, or the like, which executes computation based on the learned parameter set.

According to another aspect of the present disclosure, the charged particle beam apparatus further comprises a selector with which a user selects a particular reference image from among the plurality of reference images. According to this structure, the observation condition or the image conversion condition can be selected by a simple method of image selection.

According to another aspect of the present disclosure, the charged particle beam apparatus further comprises a controller that sets to the observation mechanism a particular presumed observation condition corresponding to the particular reference image as a next observation condition. According to this structure, the burden of the user can be significantly reduced in setting the observation condition.

According to another aspect of the present disclosure, the charged particle beam apparatus further comprises a controller that instructs the image conversion unit to execute a particular image conversion corresponding to the particular reference image. According to this structure, a desired image or an image close to the desired image can be acquired continuously without changing the actual observation condition. For example, due to damages to the target or other reasons, it may be difficult to actually increase the acceleration voltage. In this case; that is, under a low acceleration voltage, it becomes possible to observe an image which is presumed to be acquired when the acceleration voltage is increased, or an image close thereto.

According to another aspect of the present disclosure, there is provided a machine learning method of a machine learning of an image converter, wherein the method estimates, based on an image acquired under a first observation condition, an image which is presumed to be acquired under a second observation condition, and the method comprises: acquiring a plurality of image pairs forming teacher data; and providing the plurality of image pairs to the image converter and refining a parameter set in the image converter, each of the image pairs includes a first image acquired by observation of a target under the first observation condition and a second image acquired by observation of the target under the second observation condition, and, in refining the parameter set, an output image acquired by inputting the first image to the image converter and the second image serving as a correct answer image are compared to each other. The two images forming each image pair are acquired from the same part of the same target. A large number of image pairs may be acquired by changing a field of view without changing the target, or by changing the target.

According to another aspect of the present disclosure, there is provided an electronic file comprising: a learned parameter set provided to an image converter of a machine learning type which estimates, based on an image acquired under a first observation condition, an image acquired under a second observation condition; and observation condition data correlated to the learned parameter set and for setting the second observation condition to an observation mechanism of a charged particle beam apparatus. In the electronic file, the learned parameter set and corresponding observation condition data are correlated to each other. Thus, the electronic file has a special data structure for a particular usage. Alternatively, the electronic file may further include observation condition data representing the first observation condition.

BRIEF DESCRIPTION OF THE DRAWINGS

Embodiment(s) of the present disclosure will be described by reference to the following figures, wherein.

DESCRIPTION OF THE INVENTION

An embodiment of the present disclosure will now be described with reference to the drawings.

Figure 1:
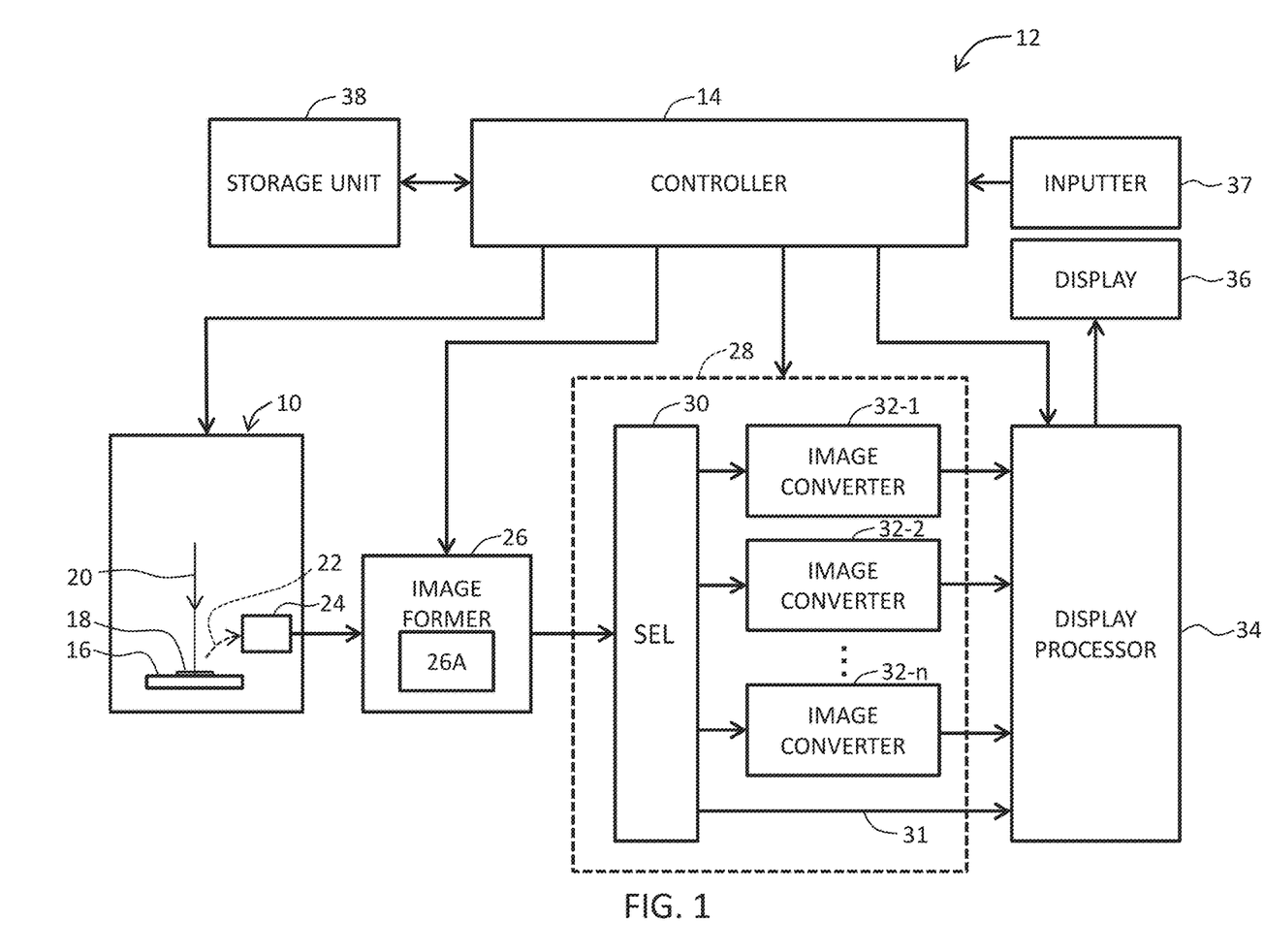
FIG. 1 is a block diagram showing an example structure of a scanning electron microscope according to an embodiment of the present disclosure.

FIG. 1 shows an example structure of a scanning electron microscope according to an embodiment of the present disclosure. The scanning electron microscope is one type of a charged particle beam apparatus. As other charged particle beam apparatuses, a transmission electron microscope, an ion beam irradiation apparatus, or the like may be exemplified. In the example structure of FIG. 1, the scanning electron microscope has an observation mechanism 10 and an information processor 12.

The observation mechanism 10 is an observation unit or a measurement unit, and has a mechanical structure and an electric structure. Specifically, the observation mechanism 10 comprises an electron gun, a deflector unit (scanner), an objective lens, a sample chamber, a detector unit, or the like. A stage 16 is provided in the sample chamber, and holds a sample 18 which is an observation target. The sample 18 is a semiconductor substrate, a living body tissue, or the like. By irradiation of an electron beam 20 to the sample 18, secondary electrons 22 are emitted from the sample 18. The secondary electrons 22 are then detected by a detector 24. Alternatively, reflected electrons emitted from the sample 18 may be detected. The detector unit is formed from a plurality of detectors including the detector 24. Normally, among the plurality of detectors, a detector corresponding to a designated detection method is used. The stage 16 is a movable structure, and a movement mechanism (not shown) is connected to the stage 16.

In the present embodiment, the information processor 12 is formed from, in addition to a user interface, a memory, or the like, a CPU which executes a program. Alternatively, the information processor 12 may be formed from a plurality of processors. Alternatively, the information processor 12 may be formed from a plurality of information processing devices on a single PC or on a network.

The information processor 12 includes a controller 14, an image former 26, an image conversion unit 28, a display processor 34, and the like. The controller 14 has a function to determine an operation condition which is set for the observation mechanism 10; that is, an observation condition for observing the sample 18. The observation condition includes various items such as an acceleration voltage, an irradiation current, a degree of vacuum, a working distance, or the like. The observation condition may further include a detection method (secondary electron detection method, reflected electron detection method, etc.), and an electron beam scanning rate.

With a relative scanning of the electron beam 20 with respect to the sample 18, detection data are acquired from each coordinate on the sample 18. The image former 26 forms an image (SEM image) based on the detection data. Data showing the image (image data) are sent to the image conversion unit 28. As necessary, the image data may be temporarily stored in a memory 26A in the image former 26.

The image conversion unit 28 functions as an estimator or an estimation means, and includes in the example structure of FIG. 1 a selector (SEL) 30, and a plurality of image converters 32-1, 32-2, . . . 32-*n* (hereinafter, the reference numerals may be omitted as necessary for the plurality of image converters). The selector 30 sends the input image data to one of the image converters. The candidate sending destination includes a bypass path 31. Each image converter is formed from a converter of machine learning type, and functions as an image filter. Specifically, each image converter is formed from a CNN (Convolutional Neural Network). Alternatively, as will be described later, the image conversion unit 28 as a whole may be formed by a single CNN.

Each image converter has a function to estimate, based on an image acquired under a first observation condition (current observation condition) and as a reference image, an image which is presumed to be acquired under a second observation condition (presumed observation condition). The reference image is an estimated image. For each combination of two observation conditions; that is, for each conversion type, an image converter is provided. In reality, one or a plurality of image converters matching the current observation condition (pre-conversion condition) are selected from among the plurality of the prepared image converters. In order to improve the degree of freedom of image conversion, desirably, a large number of image converters corresponding to a large number of combinations (a large number of conversion types) are prepared. Alternatively, it may be the case that only one image converter is provided.

In the example structure shown in the figure, the plurality of image converters matching the current observation condition can be operated in parallel to each other, and an input current image is converted into a plurality of reference images. The plurality of reference images are sent to the display processor 34. As described above, the bypass path 31 is provided inside the image conversion unit 28, and the input current image is also output via the bypass path 31 to the display processor 34, without any processing.

The display processor 34 has an image combining function, a display image generation function, or the like. A display image to be displayed on a display 36 is generated by the display processor 34. In the present embodiment, an image list including the plurality of reference images is displayed on the display 36, simultaneously with the sample observation; that is, in real time. The image list is displayed for selection of the observation condition or selection of the image conversion condition. This will be described later in detail. The display 36 is formed from an LCD (liquid crystal display), an organic EL (organic electro-luminescence) display device, or the like. Each of the image former 26, the image conversion unit 28, and the display processor 34 may be formed from, for example, a processor. Alternatively, these elements may be formed from the above-described CPU and programs.

The controller 14 controls operations of the structures shown in FIG. 1. That is, an operation of the observation mechanism 10 is controlled by the controller 14, and an operation of the image conversion unit 28 is controlled by the controller 14. Prior to an actual operation of the observation mechanism 10, the controller 14 sets on the observation mechanism 10 an observation condition as an operation condition of the observation mechanism 10.

An inputter 37 is formed from a keyboard, a pointing device, or the like. The inputter 37 functions as a selection unit or a selection means. Specifically, using the inputter 37, the user selects a particular reference image from the image list. The controller 14 sets on the observation mechanism 10 an observation condition corresponding to the selected reference image as a next observation condition, or sets on the image conversion unit 28 an image conversion condition corresponding to the selected reference image. Alternatively, as the inputter 37 and the display 36, a display device with a touch panel may be employed. In the present embodiment, a storage unit 38 stores an observation condition table and a conversion type management table, which are to be described later. Alternatively, an electronic file group to be described later may be stored in the storage unit 38.

Figure 2:
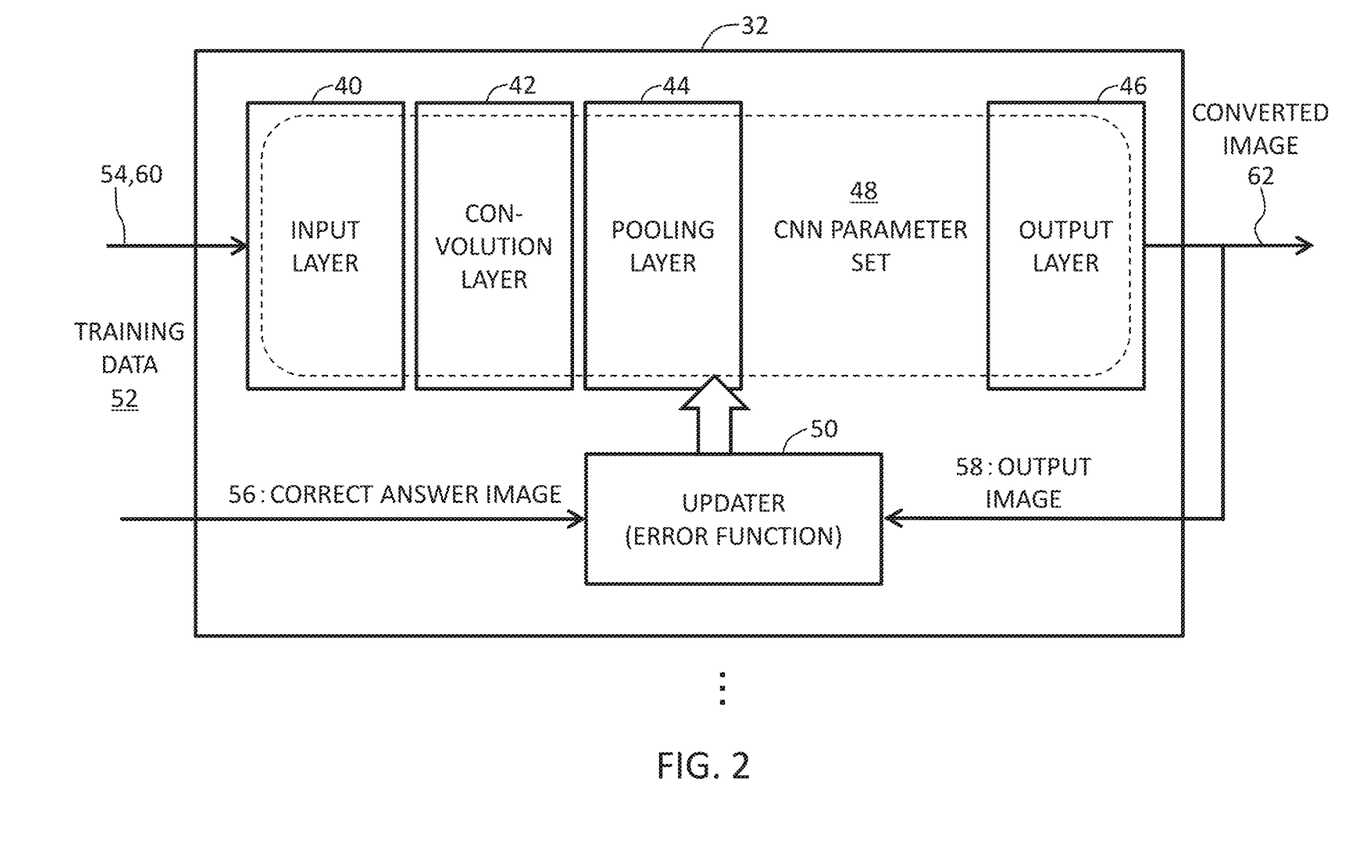
FIG. 2 is a block diagram showing an example structure of each image converter.

FIG. 2 exemplifies a general structure of the image converter. In the present embodiment, the image converter functions as an image estimator. The image converter 32 shown in the figure is formed from the CNN, which is made of a large number of layers. The large number of layers include an input layer 40, a convolution layer 42, a pooling layer 44, and an output layer 46. The large number of layers has, as a whole, a CNN parameter set 48. The CNN parameter set 48 includes a large number of weight values and a large number of bias values. The image converter 32 has an updater 50 which functions in a machine learning process for the CNN parameter set 48. The updater 50 has an error function as an evaluation function, and gradually refines or optimizes the CNN parameter set 48 so that an error defined by the error function becomes smaller.

In the machine learning process, a plurality of image pairs are provided as training data (teacher data) 52 to the image converter 32. Each image pair includes a first image 54 and a second image (correct answer image) 56 acquired by observation of the same part (field of view) of the same sample. The first image is an image acquired under a first observation condition, and the second image 56 is an image acquired under a second observation condition different from the first observation condition. The second image 56 is used as a correct answer image. When the first image 54 is input to the image converter 32, an output image 58 is output from the image converter 32 as a converted image. The updater 50 compares the output image 58 with the correct answer image 56, and refines the CNN parameter set 48 such that the output image 58 becomes closer to the correct answer image 56. Such an updating process is repeatedly executed, and finally, the CNN parameter set 48 is optimized. Through the machine learning process, the image converter 32 gains a particular image conversion function. That is, when a first image 60 acquired under the first observation condition is input to the image converter 32, a converted image 62 is output from the image converter 32 as the second image. The converted image 62 forms a reference image.

It is also possible to extract the learned CNN parameter set 48 from the image converter 32 to the outside. The extracted machine-learned CNN parameter set 48 may be incorporated as necessary into a CNN having the same structure. Alternatively, a CNN parameter set which is generated by another apparatus may be incorporated into the image converter 32.

As already described, the plurality of image converters shown in FIG. 1 correspond to a plurality of image conversion types. For each individual image converter, the machine learning as described above must be executed, or the learned CNN parameter set must be incorporated from the outside. Alternatively, a plurality of learned CNN parameter sets corresponding to the plurality of image conversion types may be prepared, and the CNN engine part may be shared among the plurality of image converters. This process will be described later in detail.

Figure 3:
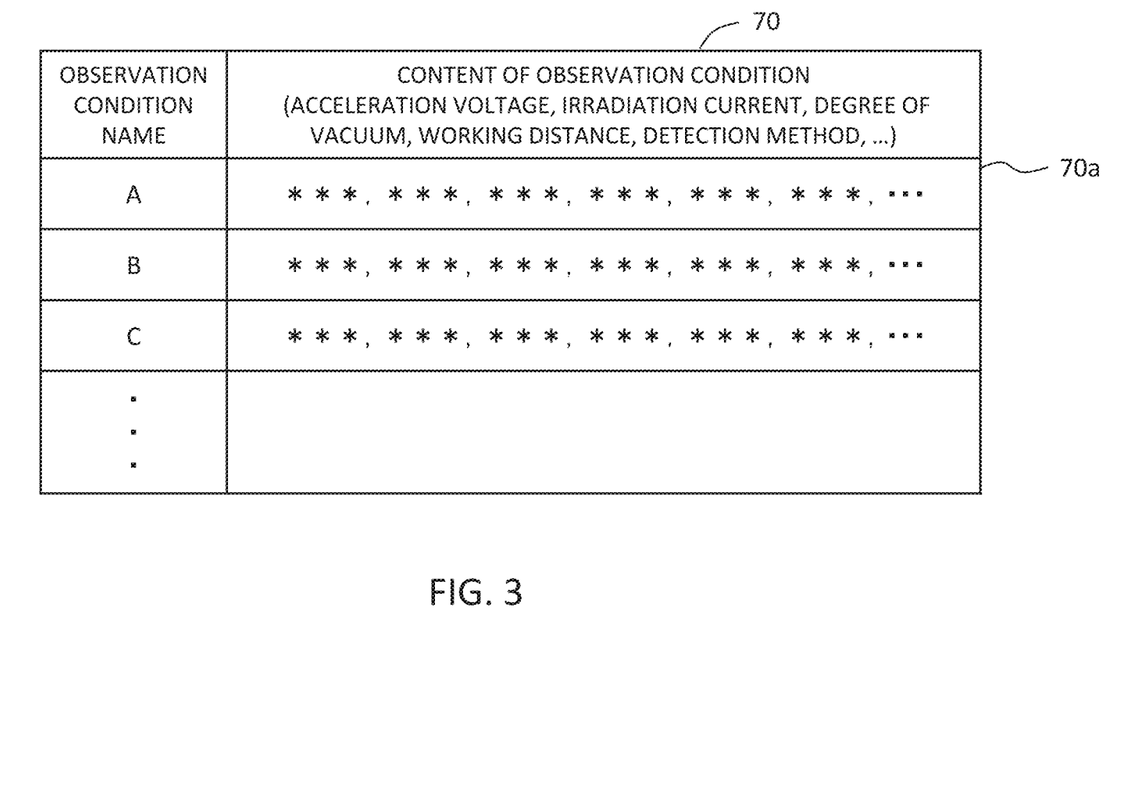
FIG. 3 is a diagram showing an example structure of an observation condition table.

FIG. 3 shows an example structure of an observation condition table. An observation condition table 70 includes a plurality of records 70*a*, each record 70*a* corresponding to one observation condition. Specifically, each individual record 70*a* includes an observation condition name (observation condition identifier) and content of the observation condition. The content of observation condition includes a plurality of item values such as, for example, the acceleration voltage, the irradiation current, the degree of vacuum, the working distance, the detection method, or the like. The controller shown in FIG. 1 specifies the content of the observation condition corresponding to a designated observation condition name, and sets an operation condition of the observation mechanism according to the content of the observation condition.

Figure 4:
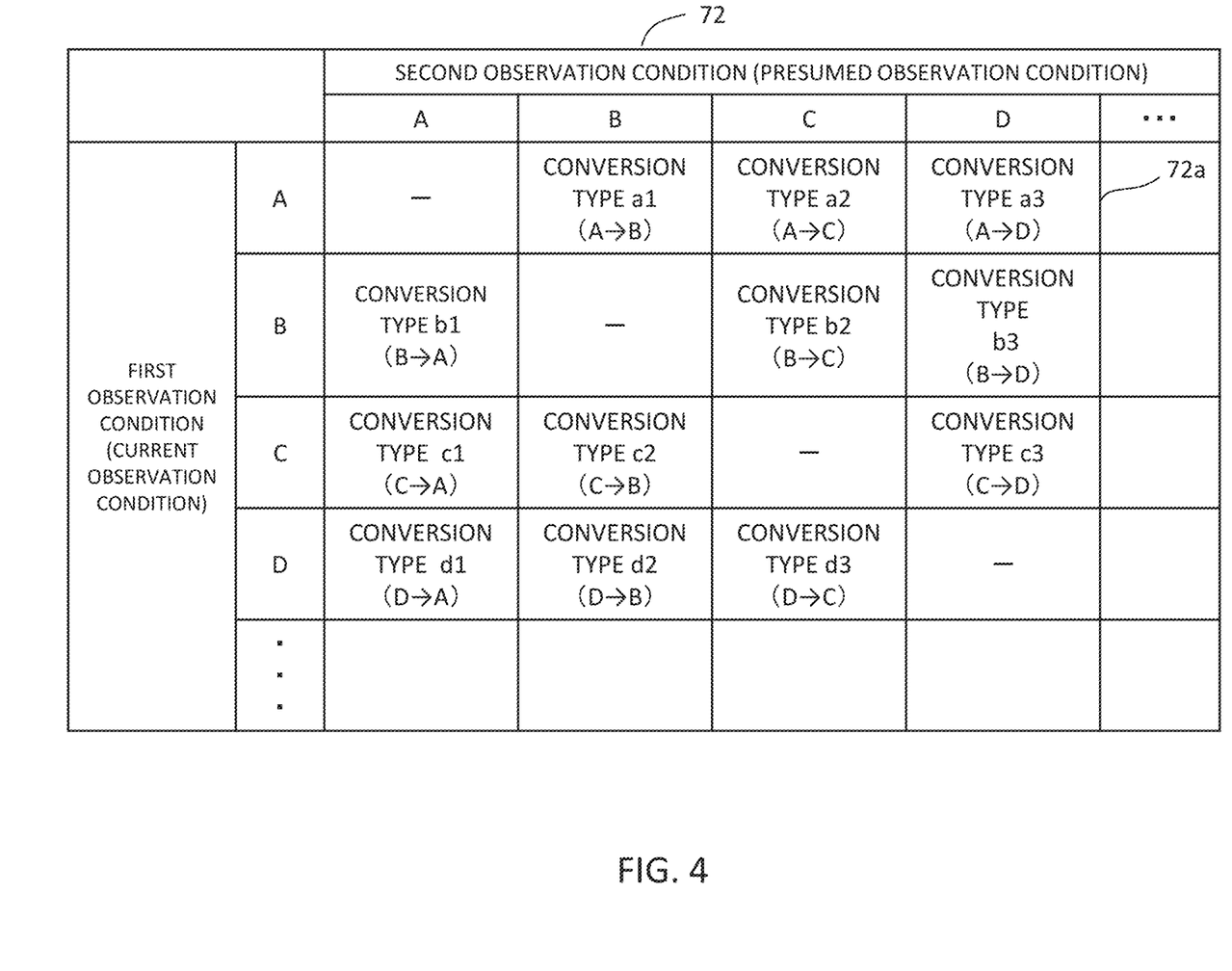
FIG. 4 is a diagram showing an example structure of a conversion type management table.

FIG. 4 shows an example structure of a conversion type management table. In a conversion type management table 72 shown in the figure, a plurality of observation condition names are listed as the first observation condition in a vertical direction, and a plurality of observation condition names are listed as the second observation condition in a horizontal direction. The first observation condition is a pre-conversion observation condition, and is a condition to be compared with the current observation condition. The second observation condition is a post-conversion observation condition. In each cell 72*a*, a conversion type is defined. To each conversion type, an image converter (or a CNN parameter set) is correlated. Typically, when displaying of the image list is instructed by the user, the controller specifies a plurality of conversion types matching the current observation condition according to the conversion type management table 72, and causes a plurality of the image converters corresponding to the plurality of conversion types to operate in parallel to each other.

However, when there is only one conversion type which matches the current observation condition, only the image converter corresponding to the conversion type operates. When a conversion type matching the current observation condition is not available, a message to that effect is displayed. According to the conversion type management table 72, the observation condition (second observation condition) corresponding to the individual conversion type can be immediately specified. The specific contents of the first observation condition and of the second observation condition are specified by referring to the above-described observation condition table.

Figure 5:
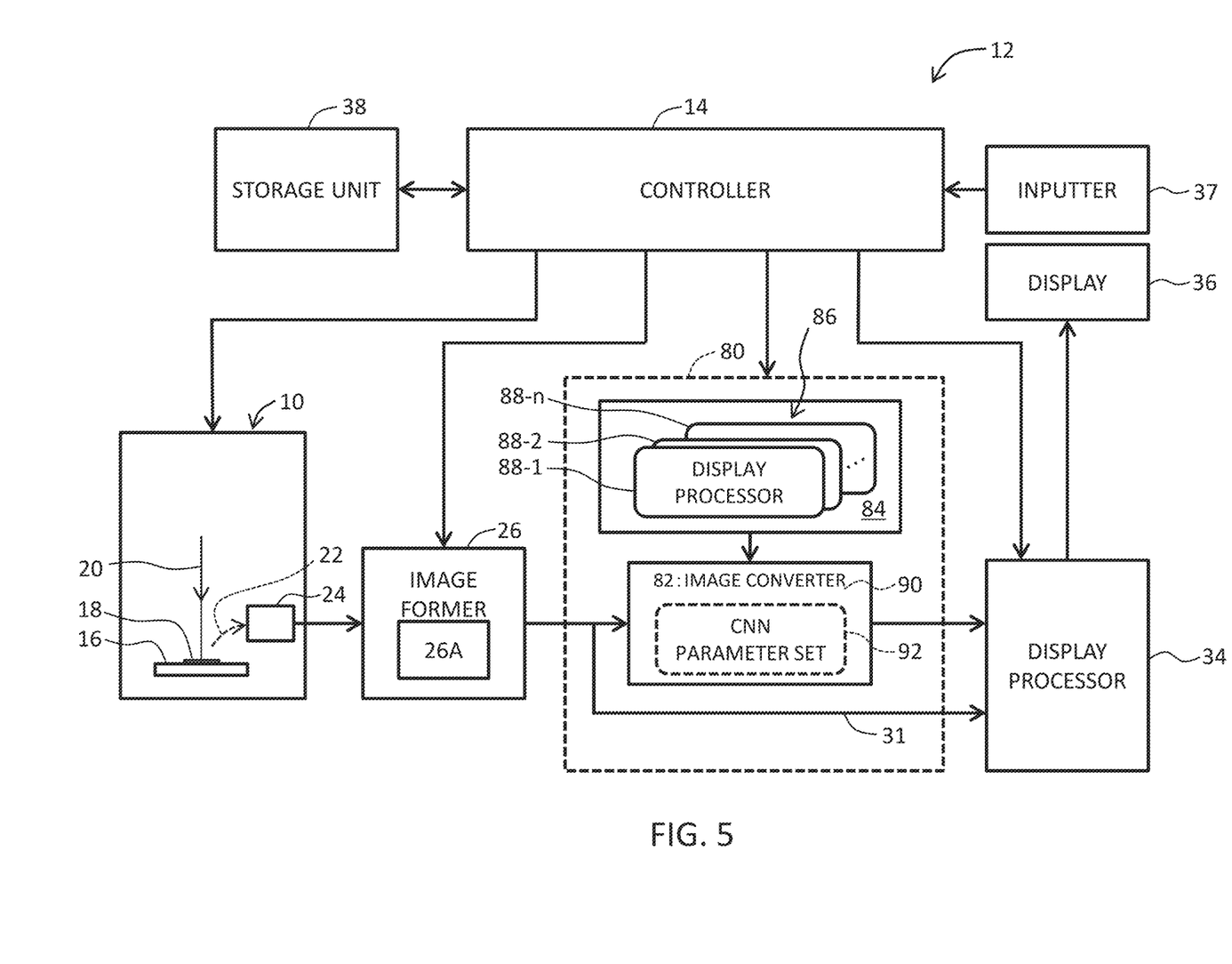
FIG. 5 is a block diagram showing another example structure of a scanning electron microscope according to an embodiment of the present disclosure.

FIG. 5 shows another example structure of the scanning electron microscope. Structures identical to those shown in FIG. 1 are assigned the same reference numerals, and their descriptions are not repeated. In the example structure of FIG. 5, an image conversion unit 80 has a single image converter 82 and a storage unit 84. The image converter 82 is formed from a CNN engine 90 and a CNN parameter set 92 incorporated therein. The storage unit 84 is formed from, for example, a memory or the like, and stores a CNN parameter set group 86. The CNN parameter set group 86 includes a plurality of learned CNN parameter sets 88-1, 88-2, . . . 88-*n* corresponding to the plurality of conversion types (hereinafter, in some cases the reference numeral may be omitted for each CNN parameter set). One CNN parameter set which is selected from among the plurality of CNN parameter sets is incorporated into the CNN engine 90 described above, and the image converter 82 is set in an operable state. Typically, the controller 14 specifies a plurality of conversion types corresponding to the current observation condition from among the plurality of prepared conversion types, sequentially incorporates the plurality of CNN parameter sets corresponding to the conversion types to the CNN engine, and sequentially operates the CNN engine with the CNN parameter sets. As a result, it becomes possible to generate a plurality of the reference images. According to the example structure of FIG. 5, addition, deletion, or the like of the conversion types can be easily achieved.

Figure 6:
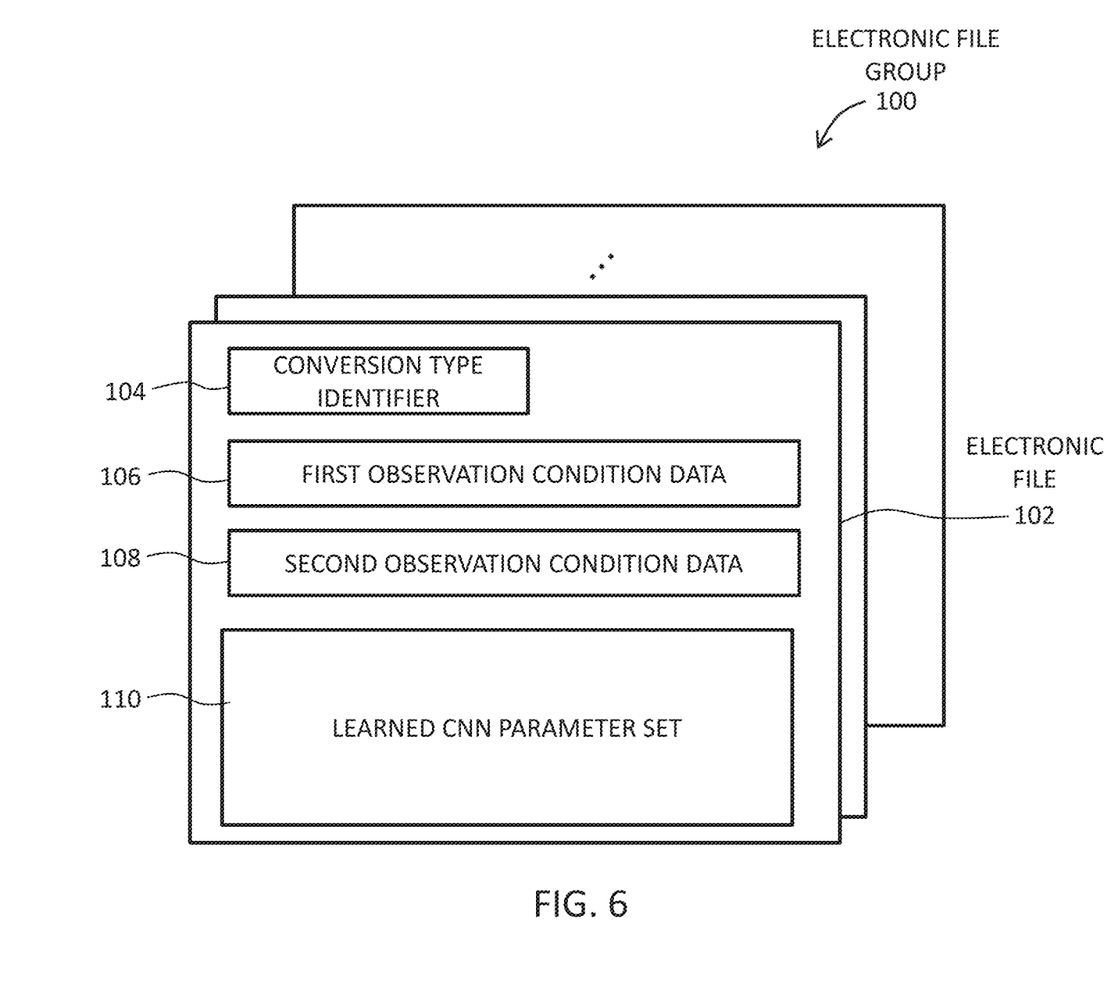
FIG. 6 is a conceptual diagram showing a file group.

In the example structure of FIG. 5, an electronic file group 100 shown in FIG. 6 may be provided from the outside via a network or a transportable recording medium to the scanning electron microscope. The electronic file group 100 is made of a plurality of electronic files 102 corresponding to the plurality of the conversion types. In the exemplified structure, each electronic file 102 includes a conversion type identifier 104, first observation condition data 106, second observation condition data 108, a learned CNN parameter set 110, and the like. The first observation condition data 106 and the second observation condition data 108 are data respectively showing the contents of the observation condition. Based on the electronic file group 100, the above-described observation condition table is formed, and the above-described conversion type management table is formed. Generation of each table is executed by the above-described controller. Further, based on the electronic file group 100, the CNN parameter set group is stored in the storage unit in the image former. The control of this process is also executed by the controller.

Because the first observation condition data and the second observation condition data are electrically correlated to the learned CNN parameter set in each electronic file 102, when the learned CNN parameter set is used, a pre-conversion image matching the CNN parameter set can be correctly judged, and, when the user selects a particular reference image from the reference image list, an observation condition corresponding to the particular reference image can be correctly set in the observation mechanism. Alternatively, in the example structure shown in FIG. 1, the electronic file group 100 shown in FIG. 6 may be provided.

Figure 7:
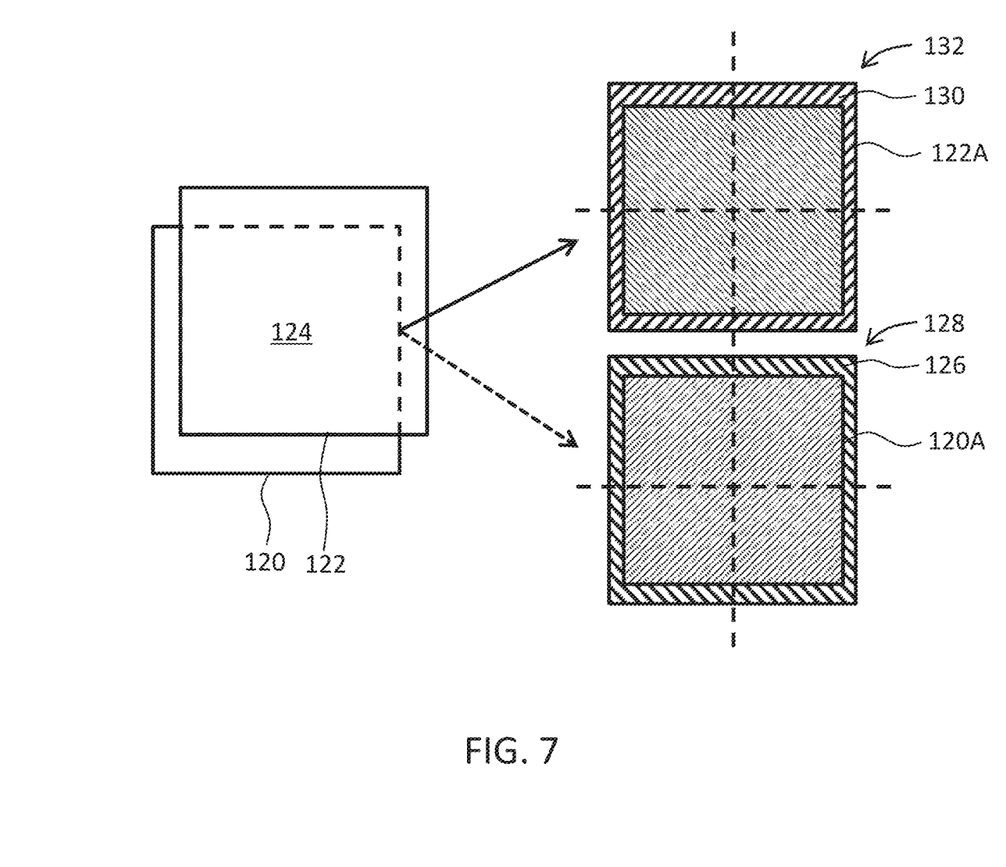
FIG. 7 is a conceptual diagram showing a deviation correction method.

With reference to FIG. 7, deviation correction will be described. As described above, in the machine learning process, a plurality of image pairs are provided to the image converter. Each image pair includes the first image and the second image acquired by observation of the same part (field of view) on the same target. The first image is the image acquired under the first observation condition, and the second image is the image acquired under the second observation condition. When there is a positional deviation between an actual observation range corresponding to the first image and an actual observation range corresponding to the second image, there is a possibility that the quality of the machine learning is reduced. In the present embodiment, in the machine learning process, the deviation correction to be described below is executed as necessary.

In FIG. 7, a position deviation is present between a first image 120 and a second image 122. Reference numeral 124 shows an overlapping range between the first image 120 and the second image 122. A filling portion 126 is added to a periphery of an overlapping portion 120A in the first image 120. With the first image 120 and the filling portion 126, a corrected first image 128 is formed. The filling portion 126 is generated using the overlapping portion 120A, and is generated, for example, by copying a part in the overlapping portion 120A, or the like. Similarly, a filling portion 130 is added to a periphery of an overlapping portion 122A in the second image 122. With the second image 122 and the filling portion 130, a corrected second image 132 is formed. Similar to the above, the filling portion 130 is generated using the overlapping portion 122A, and is generated, for example, by copying a part in the overlapping portion 122A, or the like.

The corrected first image 128 and the corrected second image 132 have the same size as the first image 120 and the second image 122 before correction, respectively. Alternatively, of the first image 120 and the second image 122, a partial image may be added only to one of these images, to correct the position deviation. Alternatively, when unification of the image size is not demanded, only the overlapping portions of the first image 120 and the second image 122 may be used as a learning image.

Figure 8:
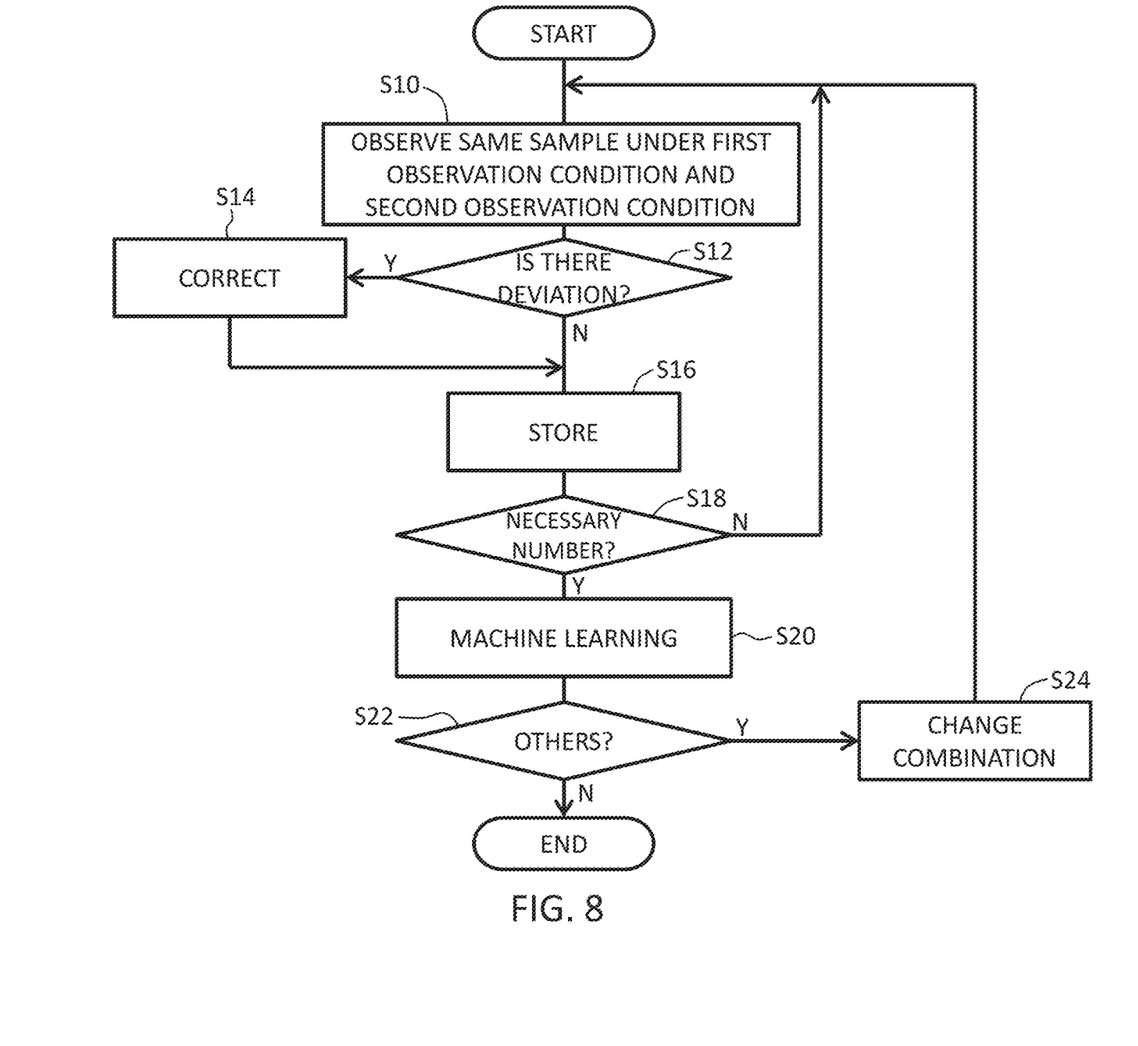
FIG. 8 is a flowchart showing a learning method according to an embodiment of the present disclosure.

FIG. 8 shows a learning method of the present embodiment as a flowchart. In S10, a sample is observed under a particular first observation condition, and the same sample is observed under a particular second observation condition. That is, while changing the observation condition, observation by electron beam scanning is executed twice for a particular range of the sample. With this process, the first image and the second image forming the image pair are acquired. The first observation condition and the second observation condition can be arbitrarily set by the user. For example, as these observation conditions, two observation conditions which only differ in a particular item (for example, the acceleration voltage) may be set. For each execution of S10, the field of view; that is, the observation part, is changed, and the sample is changed as necessary.

In S12, presence or absence of a position deviation between the first image and the second image is judged. For example, the presence or absence of, or a degree of position deviation may be judged based on a correlation computation, an image difference method, or other methods. When it is judged in S12 that there is a position deviation, deviation correction is executed in S14. For example, the position deviation is corrected by the method shown in FIG. 7. In S16, the image pair is stored. Alternatively, the correction of the position deviation may be executed after the image pair is stored.

In S18, it is judged whether or not image pairs have been acquired in a number necessary or sufficient for the machine learning, and, if the acquisition of the image pair is to be continued, the processes from S10 are repeatedly executed. In this case, a plurality of parts of the same sample may be observed, or a plurality of samples of the same type may be observed. Alternatively, a plurality of samples of different types may be observed. However, the contents of the first observation condition and those of the second observation condition are maintained.

In S20, using the plurality of image pairs acquired as described above, the machine learning of the image converter is executed. In S22, it is judged whether or not the machine learning is necessary for another conversion type. When it is judged that the machine learning is necessary, one or both of the contents of the first observation condition and those of the second observation condition are changed in S24. After the change, the processes from S10 are repeatedly executed.

As a result of the machine learning method described above, a plurality of image converters corresponding to the plurality of conversion types are formed, or a plurality of CNN parameter sets corresponding to the plurality of conversion types are formed.

Figure 9:
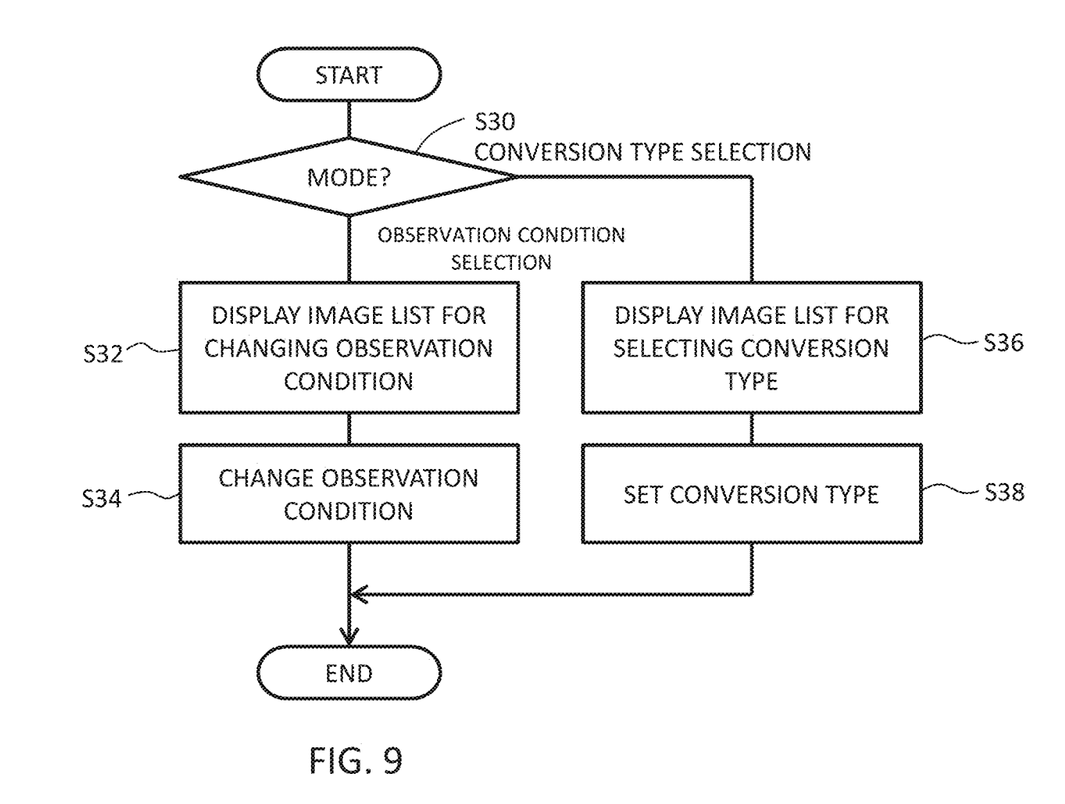
FIG. 9 is a flowchart showing a control method according to an embodiment of the present disclosure.

FIG. 9 shows a control method of the present embodiment (that is, the operation of the controller) as a flowchart. In S30, an operation mode is selected. Specifically, a mode is selected from an observation condition selection mode and a conversion type selection mode. When the observation condition selection mode is selected in S30, one or a plurality of conversion types matching the current observation condition are specified in S32, one or a plurality of image conversions corresponding to the one or the plurality of conversion types are executed, an image list for observation condition change including one or a plurality of reference images is generated as a result, and the image list is displayed. When a conversion type matching the current observation condition is not available, a message to that effect is displayed.

In S34, the user selects a particular reference image from the image list. With this process, an observation condition (second observation condition) corresponding to the reference image is set for the observation mechanism. After this process, the sample is observed under the observation condition thus set.

On the other hand, when the conversion type selection mode is selected in S30, one or a plurality of conversion types matching the current observation condition are specified in S36, one or a plurality of image conversions corresponding to the one or the plurality of conversion types are executed, an image list for conversion type change including one or a plurality of reference images is generated as a result, and the image list is displayed. Similar to the above, if a conversion type matching the current observation condition is not available, a message to that effect is displayed.

In S38, the user selects a particular reference image from the image list. With this process, the conversion type corresponding to the reference image is designated as an image conversion condition. After this process, the image conversion corresponding to the conversion type thus set is continuously applied. For example, it becomes possible to continue to display in real time, while maintaining a first acceleration voltage, an image simulating an image acquired under a second acceleration voltage which is higher than the first acceleration voltage.

Figure 10:
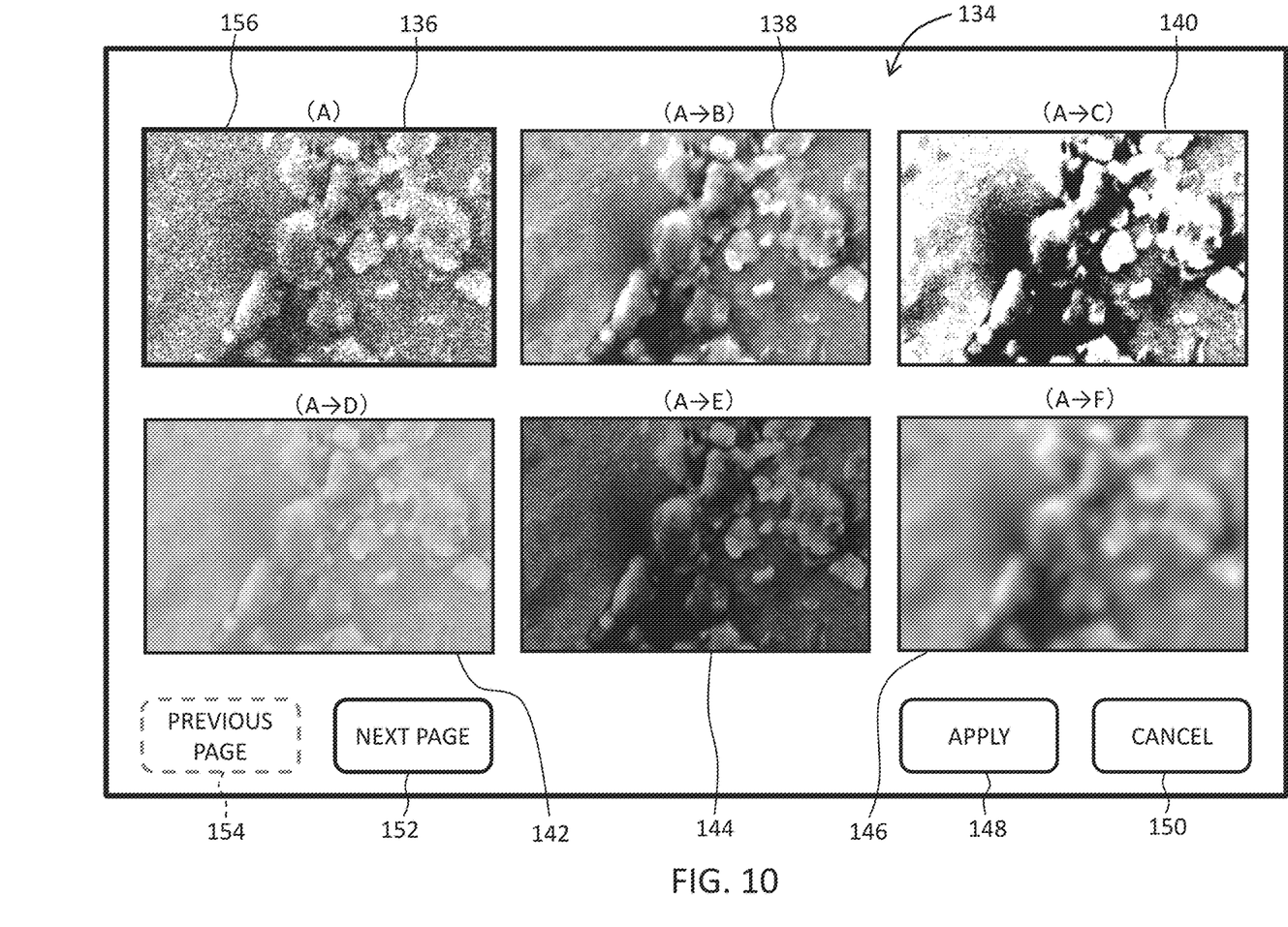
FIG. 10 is a diagram showing an example display.

FIG. 10 shows an example of the image list. The image list is displayed in real time while the target is observed. An image list 134 shown in the figure is an image list for selecting the observation condition or for selecting the conversion type. In the exemplified structure, the first observation condition; that is, the current observation condition, is represented by a symbol A, and the second observation conditions are represented by symbols B, C, D, E, and F. The image list 134 specifically includes a plurality of images, including a plurality of reference images 138-146 and a current image 136. The current image 136 is a non-converted image. The reference images 138-146 are images generated by image conversions from the first observation condition A to the second observation conditions B~F, respectively. With the display of the image list, it becomes possible to refer to images corresponding to the images which are presumed to be acquired when the second observation conditions B~F are actually set, without actually setting the second observation conditions B~F.

When a particular reference image 138-146 is selected from the image list 134 in the observation condition selection mode, and an application (apply) button 148 is operated, a second observation condition corresponding to the selected particular reference image is set in the observation mechanism as the current observation condition. In other words, it is possible to cause a setting state of a desired observation condition without specifically designating the content of the observation condition. When the current image 136 is selected, the current observation condition is maintained. On the other hand, when a particular reference image 138-146 is selected from the image list 134 in the conversion type selection mode and the application button 148 is operated, a conversion type corresponding to the selected particular reference image is fixedly selected. In other words, the image conversion corresponding to the conversion type is subsequently executed continuously. In this case, it becomes possible to continue to display an image close to an image which is presumed to be acquired under a desired observation condition, without actually setting the content of the observation condition. Similar to the above, when the current image 136 is selected, the current conversion type (no conversion) is maintained.

According to the image list 134, the plurality of images can be easily compared with each other. According to the image selection based on the image list 134, the observation condition can be changed or the conversion type can be selected with a very simple operation such as a click operation. When an image is selected, a frame of the image is displayed in a highlighted manner (refer to reference numeral 156). For cancelling the selection, a cancel button 150 is operated. When the image list 134 extends over a plurality of pages, a next page button 152 and a previous page button 154 are operated as necessary.

When an image which is presumed to be acquired under the second observation condition is estimated under the first observation condition, and is displayed as a reference image, various advantages that cannot be obtained in the related art can be achieved. For example, when an electron beam scanning rate included in the first observation condition is set high and an electron beam scanning rate included in the second observation condition is set low (the other items are identical in two observation condition; this is also true in the following descriptions), it becomes possible to achieve both a high frame rate and a high image quality. When an acceleration voltage included in the first observation condition is set low and an acceleration voltage included in the second observation condition is set high, it becomes possible to achieve both observation of a sample surface and a high resolution. When an irradiation current included in the first observation condition is set small and an irradiation current included in the second observation condition is set large, it becomes possible to achieve both prevention/reduction of damages to the sample and a high contrast. When an irradiation current included in the first observation condition is set large and an irradiation current included in the second observation condition is set small, it becomes possible to achieve both a high contrast and a high resolution. When a degree of vacuum included in the first observation condition is set low and a degree of vacuum included in the second observation condition is set high, it becomes possible to achieve both reduction of the possibility of occurrence of charge-up, and a high image quality. When a working distance included in the first observation condition is set long and a working distance included in the second observation condition is set short, it becomes possible to achieve both a high degree of freedom for a direction and a shape of the sample, and a high image quality.

Alternatively, under a circumstance that, after the execution of the conversion type selection mode, a particular image conversion is continuously executed, information or a mark specifying the second observation condition may be displayed adjacent to the image after the image conversion.

As described above, according to the present embodiment, it becomes possible to refer to an image which is presumed to be acquired when the observation condition is changed, without actually changing the observation condition. In addition, according to the above-described embodiment, user's convenience can be improved in setting the observation condition or in selecting the conversion condition.

It is also possible to execute the image conversion by a function computation unit or a matrix computation unit in place of the machine-learning type estimator. However, in such cases, in general, a significant amount of work is necessary for acquiring an intended function or an intended matrix. According to the above-described embodiment, because the image converter can be formed by simply providing a certain number of image pairs to the image converter, production of the image converter can be simplified. In addition, image conversion precision can also be improved.

Alternatively, a difference image may be generated based on two images included in the image list. For example, a difference image may be generated based on the current image and a reference image. This difference image shows an action of the image converter. Alternatively, the current image and the reference image may be combined with weights. Alternatively, two reference images may be combined with weights.

The invention claimed is:
1. A charged particle beam apparatus comprising:
an observation mechanism that observes a target by irradiation of a charged particle beam to the target;
a management table that is used to manage a plurality of conversion types between a plurality of first observation conditions to be compared with a current observation condition and a plurality of second observation conditions, each of the plurality of second observation conditions can be set to the observation mechanism;
a controller that identifies a plurality of conversion types matching the current observation condition according to the management table;
an estimator that estimates, based on a current image acquired by the observation mechanism under the current observation condition and as a reference image, an image which is presumed to be acquired by the observation mechanism under a presumed observation condition, the estimator includes an image conversion unit of a machine learning type, which converts, according to the plurality of conversion types identified by the controller, the current image to a plurality of reference images corresponding to a plurality of presumed observation conditions which is the plurality of second observation conditions corresponding to the plurality of conversion types identified by the controller;
a display that displays the plurality of reference images;
a selector with which a user selects a particular reference image from among the plurality of reference images, wherein the controller sets to the observation mechanism a particular presumed observation condition corresponding to the particular reference image as a next observation condition.

2. The charged particle beam apparatus according to claim 1, wherein the image conversion unit comprises:
   a storage unit which stores a plurality of learned parameter sets; and
   an engine to which a selected learned parameter set is sequentially incorporated from among the plurality of learned parameter sets, and
   the plurality of learned parameter sets and the engine as a whole function as a plurality of image converters of machine learning type.

3. The charged particle beam apparatus according to claim 1, wherein
   the current observation condition includes a first acceleration voltage, and
   the presumed observation condition includes a second acceleration voltage which is higher than the first acceleration voltage.

\* \* \* \* \*